United States Patent
Miu et al.

(10) Patent No.: US 6,700,174 B1
(45) Date of Patent: Mar. 2, 2004

(54) BATCH FABRICATED SEMICONDUCTOR THIN-FILM PRESSURE SENSOR AND METHOD OF MAKING SAME

(75) Inventors: Denny K. Miu, Valencia, CA (US); Weilong Tang, Alhambra, CA (US)

(73) Assignee: Integrated Micromachines, Inc., Irwindale, CA (US)

( * ) Notice: Subject to any disclaimer, the term of this patent is extended or adjusted under 35 U.S.C. 154(b) by 1040 days.

(21) Appl. No.: 08/937,859

(22) Filed: Sep. 25, 1997

Related U.S. Application Data

(63) Continuation-in-part of application No. 08/822,839, filed on Mar. 24, 1999, now Pat. No. 5,821,596.

(51) Int. Cl.⁷ .............................................. H01L 29/84
(52) U.S. Cl. ..................................................... 257/419
(58) Field of Search ............................. 338/4; 73/727; 257/417

(56) References Cited

U.S. PATENT DOCUMENTS

| | | | |
|---|---|---|---|
| 4,320,664 A | * 3/1982 | Rehn et al. | 73/708 |
| 4,462,018 A | 7/1984 | Yang et al. | 338/3 |
| 4,672,354 A | * 6/1987 | Kurtz et al. | 338/4 |
| 4,777,826 A | * 10/1988 | Rud, Jr. et al. | 73/708 |
| 4,821,011 A | * 4/1989 | Kotaki et al. | 338/4 |
| 4,876,893 A | 10/1989 | Kato et al. | 73/726 |
| 5,836,203 A | * 11/1998 | Martin et al. | 73/579 |
| 5,891,751 A | * 4/1999 | Kurtz et al. | 483/53 |

FOREIGN PATENT DOCUMENTS

| | | |
|---|---|---|
| EP | 0500234 | 8/1992 |
| JP | 02177567 | 7/1990 |
| JP | 05296864 | 11/1993 |

* cited by examiner

*Primary Examiner*—W. David Coleman
*Assistant Examiner*—Brian Dutton
(74) *Attorney, Agent, or Firm*—Bever, Hoffman & Harms, LLP; E. Eric Hoffman

(57) ABSTRACT

A pressure sensor having a flexible membrane which is moved by an external force, such as pressure from an air flow. The flexible membrane extends over a semiconductor frame having an opening, such that a portion of the flexible membrane extends over the semiconductor frame, and a portion of the flexible membrane extends over the opening. An inherent tensile stress is present in the membrane. One or more strain gage resistors are formed on the portion of the membrane which extends over the opening of the semiconductor frame. The membrane deforms in response to an externally applied pressure. As the membrane deforms, the strain gage resistors elongate, thereby increasing the resistances of these resistors. This change in resistance is measured and used to determine the magnitude of the external pressure. In one embodiment, a Wheatstone bridge circuit is used to translate the change in resistance of the strain gage resistors into a differential voltage.

12 Claims, 14 Drawing Sheets

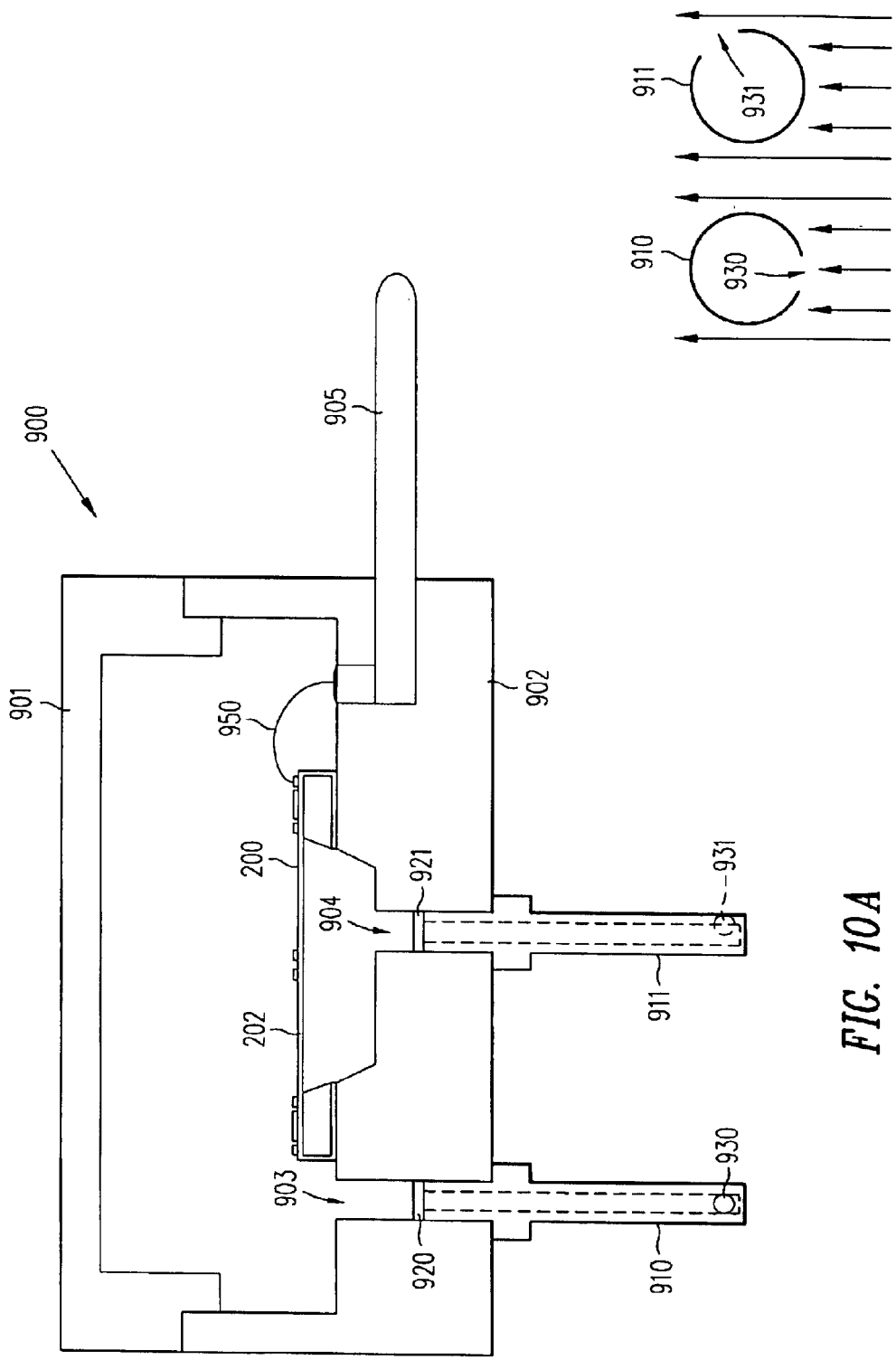

BATCH FABRICATED SEMICONDUCTOR THIN-FILM PRESSURE SENSOR AND METHOD OF MAKING SAME

RELATED APPLICATIONS

The present application is a continuation-in-part of U.S. patent application Ser. No. 08/822,839, "Batch Fabricated Semiconductor Micro-Switch and Method of Making Same", filed on Mar. 24, 1997 now U.S. Pat. No. 5,821,596 by Miu et al.

FIELD OF USE

The present invention relates to a pressure sensor which undergoes physical movement in response to an applied external force. This invention also relates to techniques for fabricating such a pressure sensor.

BACKGROUND ART

Conventional silicon micromachined pressure sensors typically use either piezo-resistive or capacitive elements to sense the deflection of a thin silicon diaphragm. Piezo-resistive elements are much more common than capacitive elements because the piezo-resistive elements have a lower cost, as well as greater product familiarity and acceptance.

FIG. 1A is a top view of a conventional silicon micromachined piezo-resistive pressure sensor 1. Pressure sensor 1 is fabricated on a silicon substrate 2 having an area of 2 mm by 2 mm and a thickness on the order of 500 µm. To increase the sensitivity of pressure sensor 1, substrate 2 is fabricated to include a frame 2a, an annular diaphragm 2b and a circular platform 2c. Diaphragm 2b is etched to have a thickness on the order of 10 µm, while frame 2a, and platform 2c remain at a thickness of approximately 500 µm. As a result, the deformation of substrate 2 will be concentrated within the annular diaphragm 2b, thereby increasing the sensitivity of pressure sensor 1.

Four Wheatstone bridge circuits 3a, 3b, 3c and 3d are formed on substrate 2. Each of these Wheatstone bridge circuits includes a plurality of contact pads 4, a plurality of piezo-resistive elements 5, and conductive traces for connecting the pads 4 and piezo-resistive elements 5. Piezo-resistive elements 5 are formed by ion implanting impurity regions into the annular diaphragm 2b. The resistances of piezo-resistive elements 5 change in response to mechanical stresses applied to the crystalline substrate 2. More specifically, the resistances of piezo-resistive elements 5 change in response to compression and dilation of diaphragm 2b. This annular diaphragm 2b and the position of piezo-resistive elements 5 provides a 25 to 50 times increase in the gauge factor, such that pressure sensor 1 can provide an output voltage on the order or 2 to 3 mV/V when designed for full range of differential pressure on the order of a 4 inch water column (WC).

In the past, pressure sensor 1 has typically been used for high pressure range sensing applications in the automobile world. Such applications include, for example, measurements of manifold absolute pressure, transmission fluid pressure, coolant and power steering pressure and tire pressure.

The effectiveness of pressure sensor 1 is determined by a combination of two physical effects, which can be explained in terms of a mechanical amplifier cascaded with an electrical amplifier. The mechanical amplifier is diaphragm 2b which converts pressure into displacement. The electrical amplifier is the combination of piezo-resistive elements 5 and Wheatstone bridge circuits 3a–3d, which convert displacement into output voltage.

There are a number of inherent disadvantages associated with pressure sensor 1. First, platform 2c acts as a seismic mass which causes an excessive amount of dynamic deflection in response to shock and vibration (i.e., noise). Platform 2c can further cause an excessive amount of static deflection in response to gravity, thereby making the sensor highly sensitive to mounting positions). As a result, the operation of pressure sensor 1 can be affected by the position and environment in which pressure sensor 1 is mounted.

In addition, piezo-resistive elements 5 act as pyro-resistors, thereby making pressure sensor 1 extremely sensitive to temperature changes. As a result, sophisticated temperature compensation schemes must typically be used with pressure sensor 1. It is typical that even after such temperature compensation is provided, the temperature effects are on the order of 1 to 2 percent of full range.

Furthermore, annular diaphragm 2b is typically very fragile, thereby rendering pressure sensor 1 prone to damage during transportation, handling and assembly. Also, while the annular diaphragm 2b increases the sensitivity of the mechanical amplifier portion of pressure sensor 1, the shape of annular diaphragm 2b limits the linear elastic range the diaphragm 2b. As a result, the performance of pressure sensor 1 can be nonlinear if the deformation of diaphragm 2b exceeds the linear elastic range of the silicon diaphragm.

Moreover, because of the inherent stiffness of silicon substrate 2, pressure sensor 1 is better suited for high pressure applications (i.e., measuring pressures greater than 1 psi), rather than low pressure applications (i.e., measuring pressures less than 1 psi).

FIG. 1B is a cross sectional view of a conventional capacitive differential pressure sensor 20 which is used to measure pressure. Pressure sensor 20 is formed by sandwiching an etched silicon diaphragm 29 (which is etched from a silicon substrate 28) between an upper glass plate 30 and a lower glass plate 27. Pressure ports 25 and 26 are formed through the upper and lower glass plates 30 and 27, respectively, to vent silicon diaphragm 29. Aluminum is sputtered to the inner surfaces of the upper and lower glass plates to form fixed capacitor plates 23 and 24. Connectors 21 and 22 extend from plates 23 and 24, respectively, along the walls of pressure ports 25 and 26, to the outer surfaces of the upper and lower glass plates 30 and 27. The silicon diaphragm 29 forms a movable center capacitive plate of the sensor 20 in a configuration similar to a capacitive potentiometer. A positive pressure applied to pressure port 25 causes the silicon diaphragm 29 to deflect toward the lower glass plate 27, thereby increasing the capacitance between diaphragm 29 and plate 24, while decreasing the capacitance between diaphragm 29 and plate 23. The imbalance, which is directly proportional to pressure, is detected by an electronic circuit.

Pressure sensor 20 to exhibits the following disadvantages. First, silicon diaphragm 29, being relatively thick (i.e., having a thickness of at least about 5 microns), can experience an excessive amount of dynamic deflection in response to shock and vibration. Furthermore, as silicon diaphragm 29 is made thinner for low pressure applications (i.e., a thickness of approximately 5 microns) it is difficult to fabricate a substantially planar diaphragm. A non-planar diaphragm can result in erroneous capacitance measurements. Moreover, as silicon diaphragm 29 is made thinner for low pressure applications, the diaphragm becomes very fragile, thereby rendering pressure sensor 20 prone to damage during transportation, handling and assembly.

It would therefore be desirable to have a low-cost, reliable pressure sensor which is relatively insensitive to temperature, dynamic shock and gravitational forces. It would also be desirable if such pressure sensor is relatively sturdy and has a wide linear elastic range. It would further be desirable if such pressure sensor were well suited for low pressure applications.

SUMMARY

Accordingly, the present invention provides a sensitive pressure sensor which includes a flexible membrane, such as low-stress silicon nitride, which is supported by a semiconductor frame. The flexible membrane extends over the frame, and an inherent tensile stress is present in the membrane. A thin film strain gage material, such as nickel-chrome, is deposited over the flexible membrane to form one or more variable resistance resistors over the flexible membrane.

When an external pressure, such as a dynamic pressure drop due to an air flow, is applied to the membrane, the membrane is deformed out of plane. When the membrane is deformed out of plane, the variable resistance resistors increase in length, and thereby increase in resistance. The increase in resistance is monitored by an electronic circuit, such as a Wheatstone bridge circuit. The sensor circuit generates an output signal which is proportional to the deflection of the membrane. Since there is only tensile stress in a membrane (as opposed to both tensile and compressive stresses in a diaphragm which is thicker and can support bending), the output signal provided by the pressure sensor of the invention is the same whether the membrane is deformed up or down, such that the output signal is proportional to the differential pressure.

Because there is no proof mass attached to the flexible membrane, the pressure sensor of the present invention is immune to shock, vibration, and orientation. In addition, the resistance of the strain gage material is based purely on geometric effect, such that the pressure sensor of the present invention is very temperature stable. Furthermore, the flexible membrane undergoes a relatively large deformation (in comparison with sensor 1) for a given applied pressure differential. This provides a relatively sensitive and stable sensor, suitable for low pressure applications.

The flexible membrane is made of a strong material which can withstand a large applied pressure differential. Because the membrane is under tensile stress, the out-of-plane displacement is linearly proportional to the applied pressure. Moreover, because the membrane is thin, its mass is negligible, such that the applied gravitational forces resulting from mishandling are much too small to damage the pressure sensor.

The pressure sensor of the present invention can be mounted as a single die in a standard housing. Alternatively, the pressure sensor can be mounted between two silicon dies, which act as over-pressure stoppers to limit the deformation of the membrane.

In accordance with another embodiment, a first conductive layer is formed over the membrane, and a second conductive layer is formed over an over-pressure stopper. In this embodiment, the first and second conductive layers to form a capacitive pressure sensor.

The present invention will be more fully understood in light of the following detailed description taken together with the drawings.

BRIEF DESCRIPTION OF THE DRAWINGS

FIG. 10A is a cross sectional view of a pressure sensor assembly in accordance with one embodiment of the invention;

FIG. 10B is a top view of the air flow tubes of the pressure sensor assembly of FIG. 10A;

DETAILED DESCRIPTION

Figure 2:
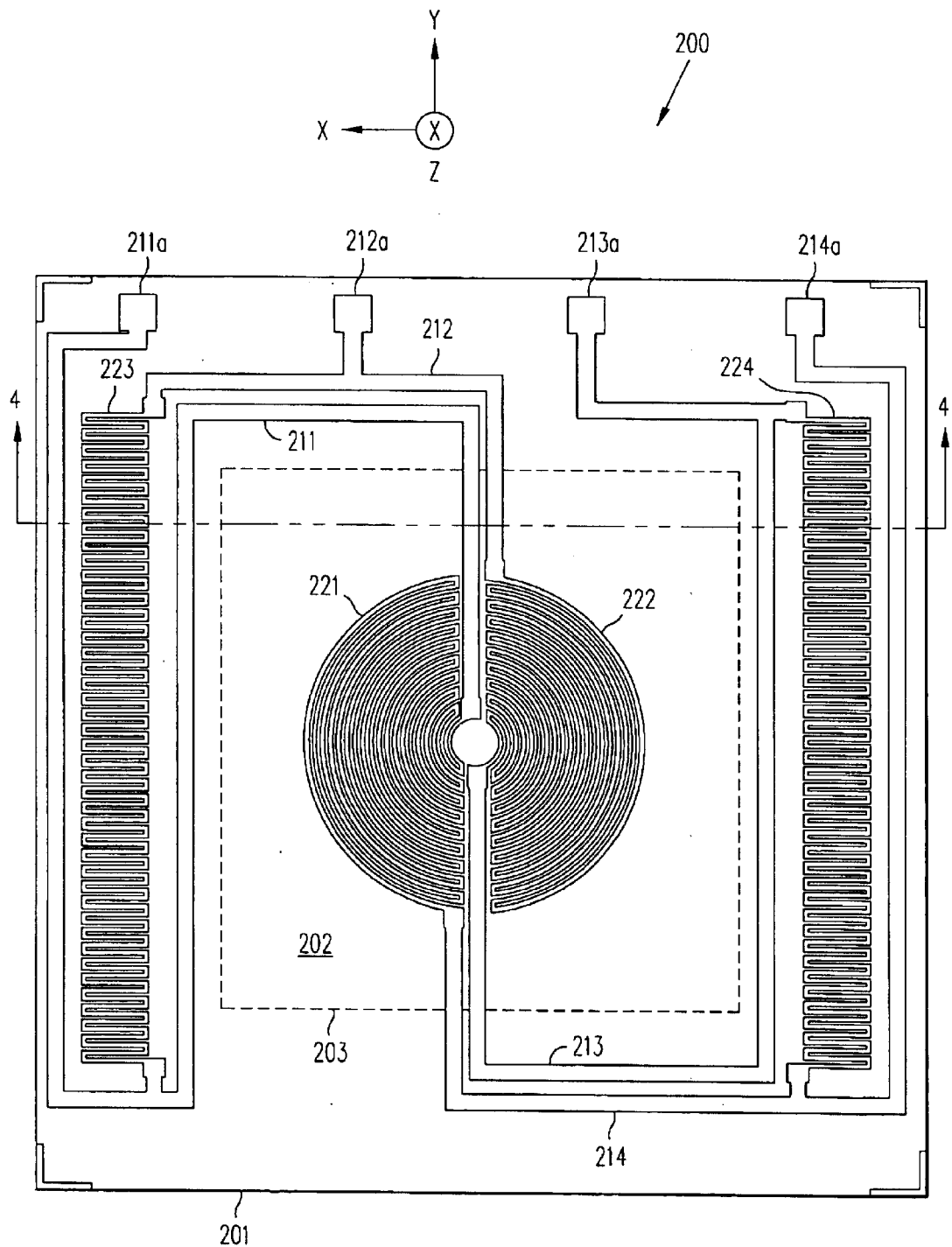
FIG. 2 is a top view of a thin film transducer pressure sensor in accordance with one embodiment of the present invention.
Figure 3:
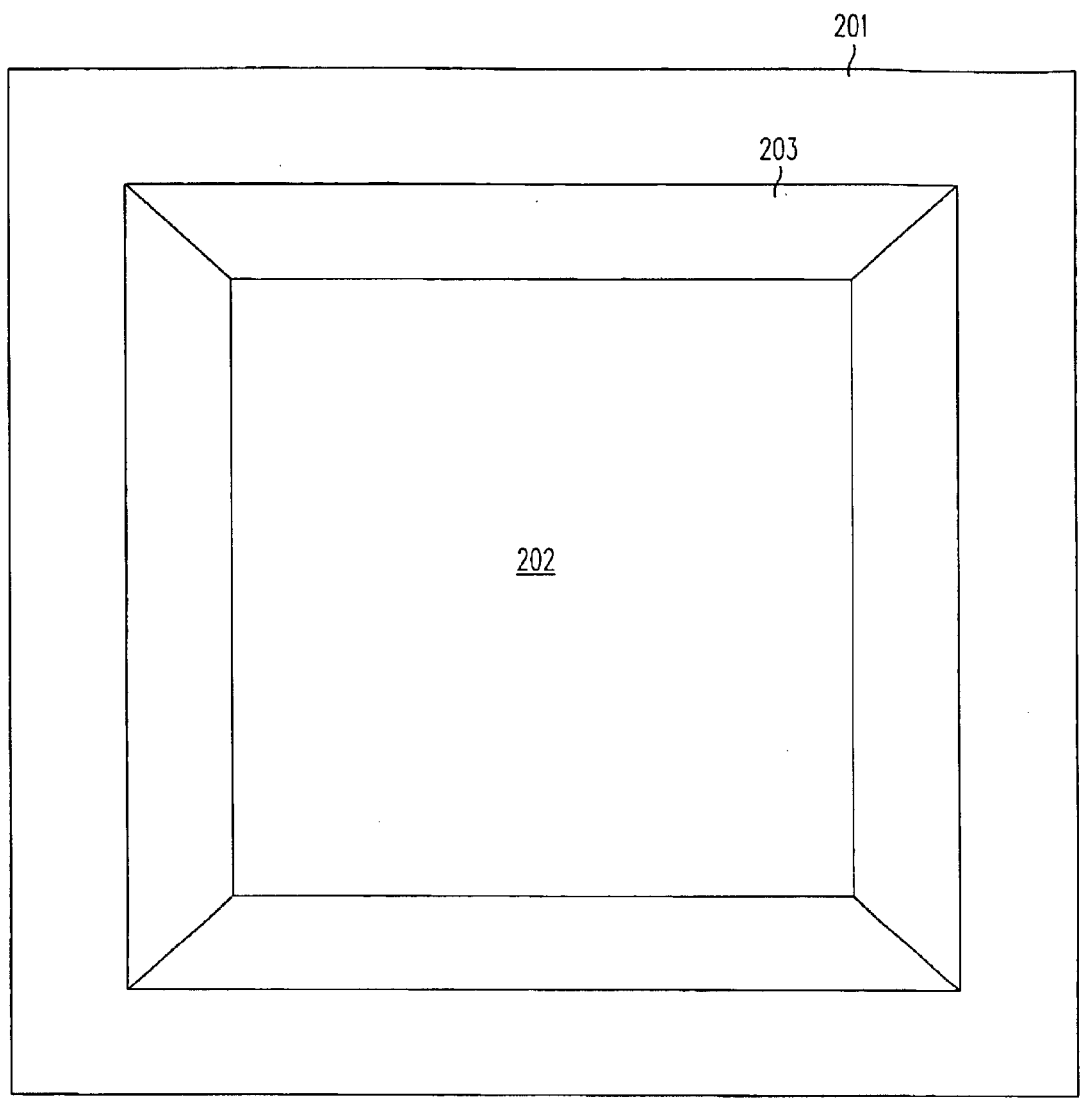
FIG. 3 is a bottom view of the pressure sensor of FIG. 2.
Figure 4:
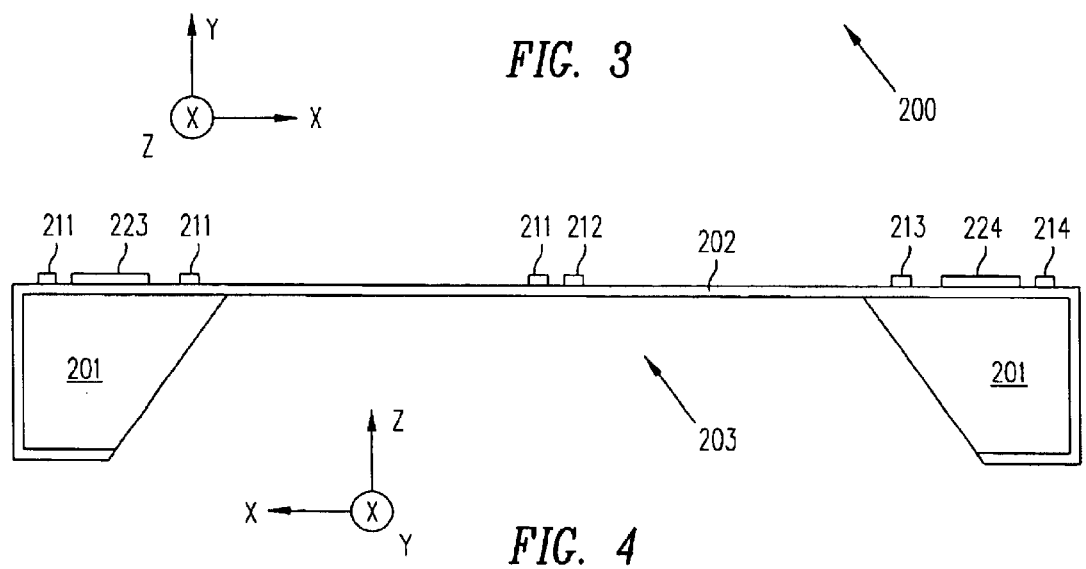
FIG. 4 is a cross sectional view of the pressure sensor of FIG. 2 along section line 4—4 of FIG. 2.

FIG. 2 is a top view of a pressure sensor 200 in accordance with one embodiment of the present invention. FIG. 3 is a bottom view of pressure sensor 200. FIG. 4 is a cross sectional view of pressure sensor 200 along section line 4—4 of FIG. 2. FIGS. 2–4 use the illustrated X-Y-Z coordinate system.

Pressure sensor 200 includes semiconductor frame 201, flexible membrane 202, electrically conductive traces 211–214, electrically conductive pads 211a–214a, and strain gage resistors 221–224. Semiconductor frame 201 is a monocrystalline semiconductor material. In the described example, frame 201 is monocrystalline silicon having a <100>orientation. However, frame 201 can be made of other semiconductor materials in other embodiments. Frame 201 has dimensions of approximately 0.6 cm along the X-axis, 0.6 cm along the Y-axis, and 400 $\mu$m along the Z-axis. A centrally located opening 203 extends completely through frame 201.

Frame 201 supports a low-stress, flexible membrane 202. In the described example, membrane 202 is a silicon rich, silicon nitride membrane which extends over opening 203 at the upper surface of frame 202. In the described embodiment, the silicon nitride membrane 202 has a thickness of approximately 2,000 Angstroms. In other embodiments, membrane 202 can be made of other materials, such as polyimide. The intrinsic tensile stress of membrane 202 tends to hold membrane 202 in a plane which is parallel to the X-Y plane. However, membrane 202 is compliant along the Z-axis. Thus, when frame 201 is fixed and a force is applied to membrane 202 along the Z-axis, membrane 202 deforms to move along the Z-axis. The forces required to deform membrane 202 are on the order of 250 $\mu$N. The amount of deformation of membrane 202 along the Z-axis in the presence of these forces is approximately 0.5 $\mu$m.

Figure 1A:
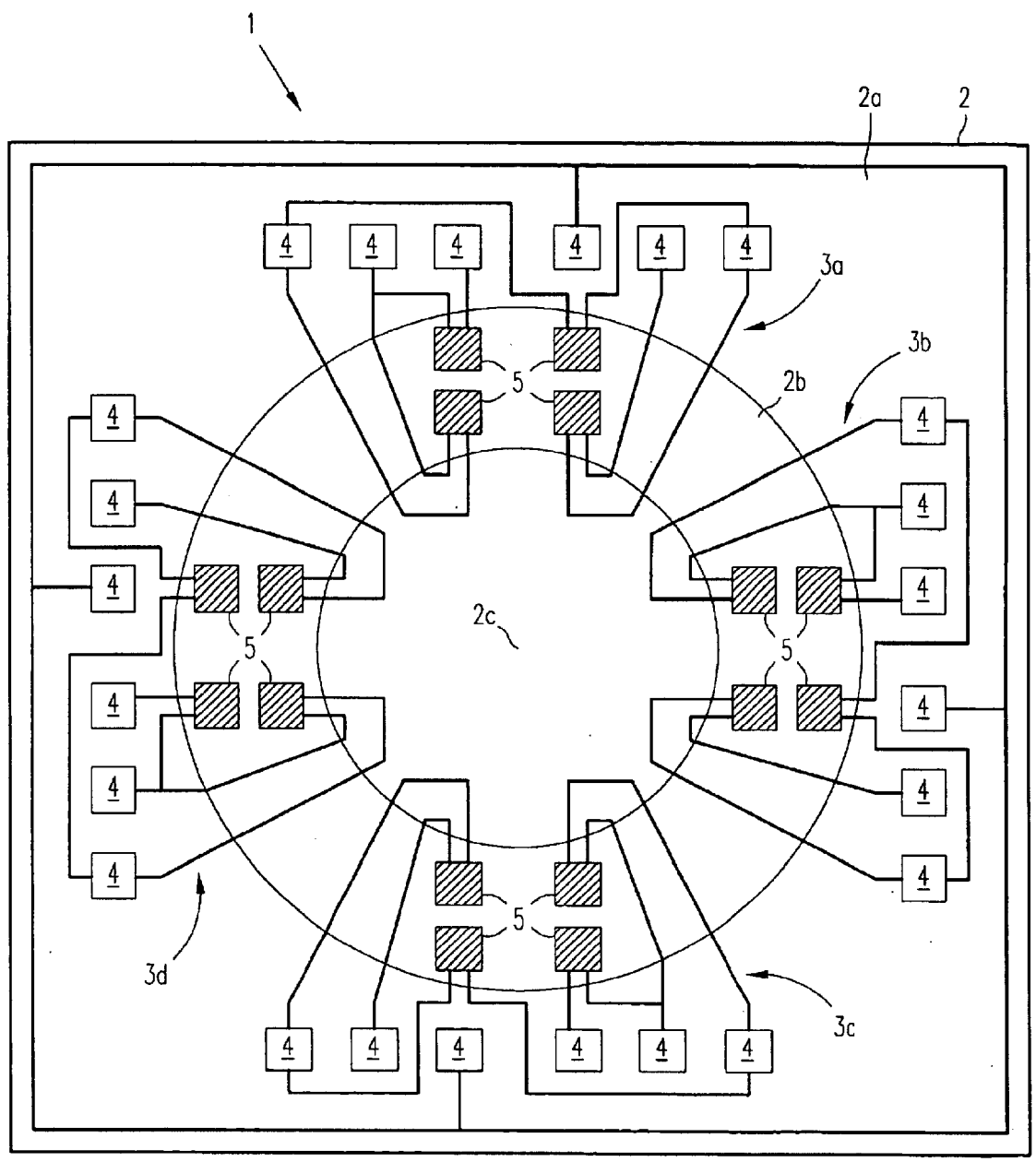
FIG. 1A is a top view of a conventional silicon micromachined piezo-resistive pressure sensor.
Figure 1B:
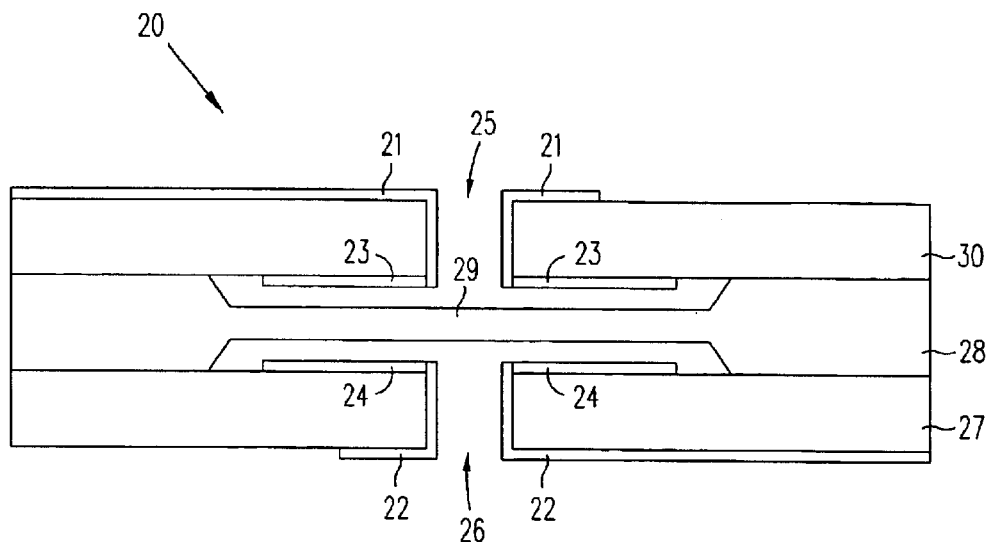
FIG. 1B is a cross sectional view of a conventional capacitive differential pressure sensor.

Membrane 202 provides for a greatly improved mechanical amplification factor with respect to the conventional piezo-resistive pressure sensor 1 (FIG. 1A). Because membrane 202 is pre-stressed, the membrane acts more like a taut cable in a suspension bridge than a cantilever beam. The out-of-plane stiffness of membrane 202 is not a function of Young's modulus or the cross-sectional inertia of the membrane material, but rather, is a function of the well controlled inherent tensile stress of membrane 202. The inherent pre-stressing of membrane 202 is described in more detail below in connection with the fabrication of pressure sensor 200.

Strain gage resistors 221–224 are formed over the exposed surface of membrane 202. Strain gage resistors are defined as resistors formed from a strain gage material. Strain gage material is defined to mean electrically conductive material which has a resistance which is proportional to the length of the material and inversely proportional to the cross sectional area of the material. In the described example, strain gage resistors are made of nickel-chrome (which is approximately 80 percent nickel and 20 percent chrome). Other strain gage materials include chrome or titanium. Strain gage resistors 221–224 are selected to have identical lengths and cross sectional areas when membrane 202 is not deflected along the Z-axis. As a result, strain gage resistors 221–224 have identical resistances when membrane 202 is not deflected along the Z-axis. In the described example, each of strain gage resistors 221–224 has a thickness of about 500 Angstroms and a resistance of approximately 5000 ohms (at room temperature), when membrane 202 is not deflected along the Z-axis. Although strain gage resistors 221–224 have the same composition in the described example, this is not required by the present invention. In a non-preferred embodiment, resistors 223 and 224 could be fabricated using a different material (including a non strain gage material) than the strain gage material used to fabricate strain gage resistors 221–222. In this embodiment, resistors 223 and 224 are designed to have the same resistance as strain gage resistors 221 and 222 when membrane 202 is not deformed along the Z-axis.

Strain gage resistors 221 and 222 are formed in a semi-circular, serpentine pattern as illustrated in FIG. 2. Strain gage resistors 221 and 222 are formed entirely over the portion of membrane 202 which is not directly connected to frame 201. That is, strain gage resistors 221 and 222 are formed over the portion of membrane 202 which is located over the opening 203 of frame 201. (Opening 203 is shown by the dashed line in FIG. 2.) As a result, strain gage resistors 221 and 222 increase in length and decrease in cross sectional area as membrane 202 moves out of the X-Y plane. As described in more detail below, the resistances of these strain gage resistors 221 and 222 increase under these conditions.

Strain gage resistors 223 and 224 are formed in a linear serpentine pattern as illustrated in FIG. 2. Strain gage resistors 223 and 224 are formed entirely over the portion of membrane 202 which is directly connected to frame 202. That is, strain gage resistors 223 and 224 are formed directly over frame 203. As a result, strain gage resistors 223 and 224 do not expand in any significant manner as membrane 202 moves out of the X-Y plane.

Electrically conductive traces 211–214 are formed from a low-resistance material, such as a metal or metal alloy. In the described example, traces 211–214 are formed from gold or a gold alloy having a thickness of approximately 2000 Angstroms and a width of approximately 100 $\mu$m. As a result, the resistances of traces 211–214 are much less than the resistances of strain gage resistors 221≧224. Traces 211–214 couple strain gage resistors 221–224 to form a Wheatstone bridge circuit. More specifically, trace 211 couples a first terminal of resistor 223 to a first terminal of resistor 221. Trace 212 couples a second terminal of resistor 223 to a first terminal of resistor 222. Trace 213 couples a second terminal of resistor 222 to a first terminal of resistor 224. Trace 214 couples a second terminal of resistor 221 to a second terminal of transistor 224. Pads 211a–214a are formed at the ends of traces 211–214, respectively, thereby providing connection points for the Wheatstone bridge circuit.

Figure 5A:
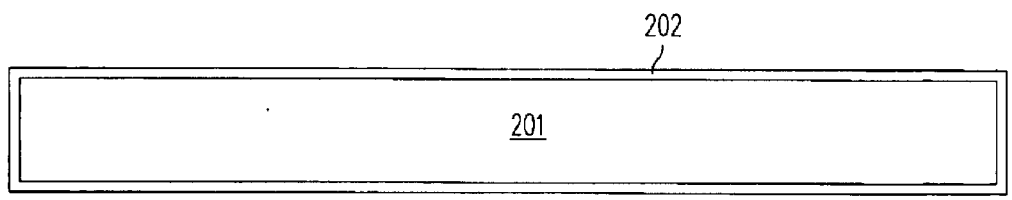
FIGS. 5A–5G are cross sectional views illustrating the pressure sensor of FIGS. 2–4 during selected processing steps.
Figure 5B:
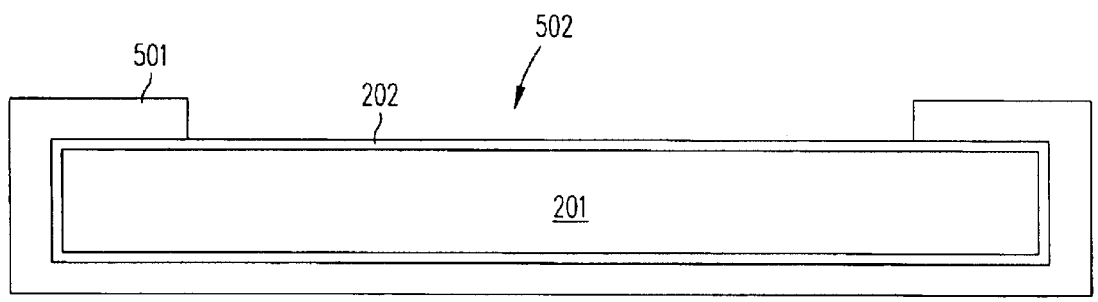

Pressure sensor 200 is fabricated as follows in accordance with one embodiment of the present invention. FIGS. 5A–5G illustrate pressure sensor 200 during particular processing steps. Initially, monocrystalline silicon substrate 201 is cleaned. Then, as illustrated in FIG. 5A, a layer of silicon nitride 202 is deposited over the outer surfaces of substrate 201. In the described method, the silicon nitride layer 202 has a thickness of approximately 2000 Å, although other thicknesses are possible. As shown in FIG. 5B, a photoresist layer 501 is then deposited over the silicon nitride layer 202. The photoresist layer 501 is patterned to define an opening 502. In the described method, this opening 502 has a square shape.

Figure 5C:
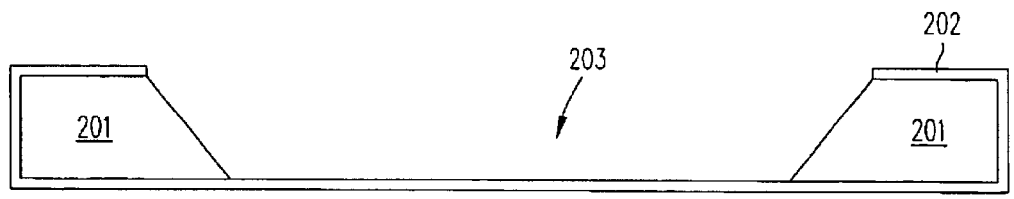

Turning now to FIG. 5C, a plasma etch is performed to remove the portion of the silicon nitride layer 202 which is exposed by the opening 502. After removing the photoresist, a KOH etch is then performed on the resulting structure. As shown in FIG. 5C, the KOH etch forms opening 203, which extends through substrate 201, thereby causing the substrate to form frame 201. Because the KOH etch does not attack the silicon nitride layer 202, the silicon nitride layer 202 remains as a membrane across opening 203. This membrane 202 has an inherent tensile stress due to the method of fabrication.

Figure 5D:
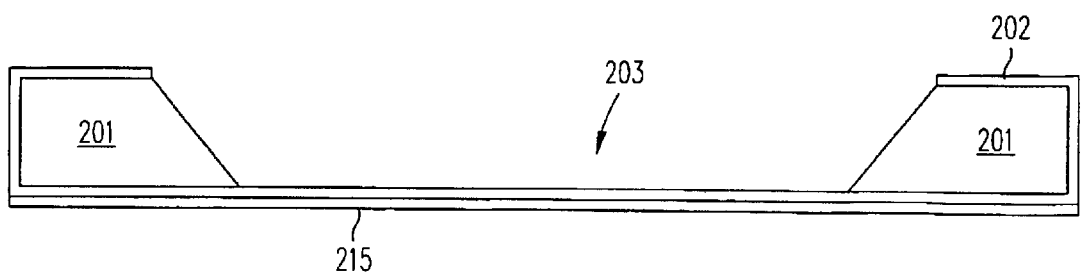
Figure 5E:
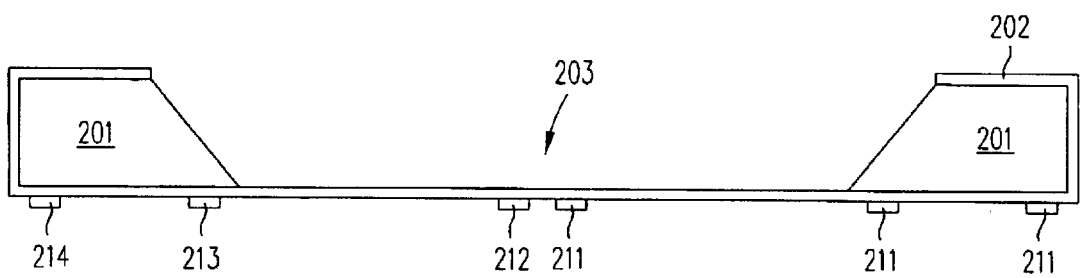
Figure 5F:
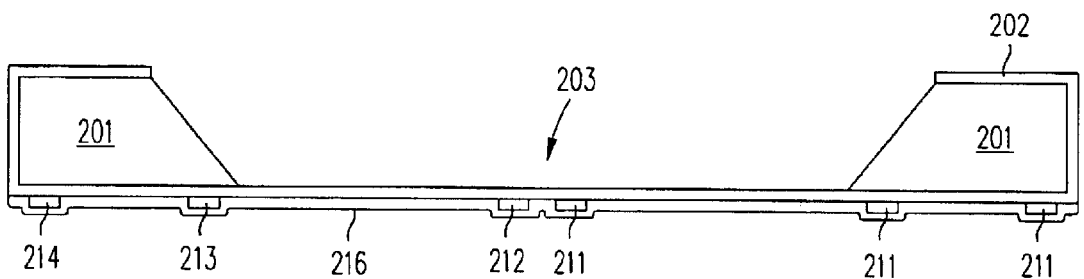
Figure 5G:
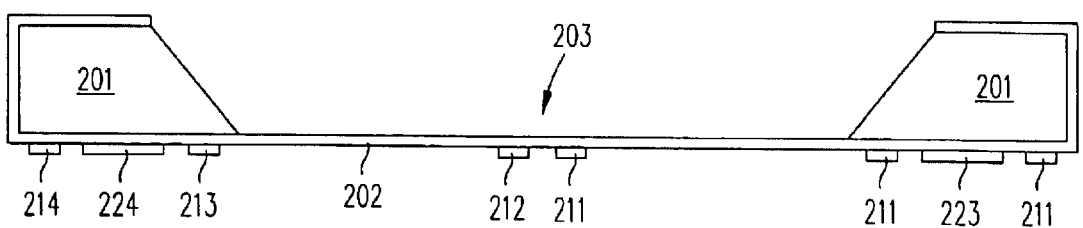

As shown in FIG. 5D, a layer of gold 215 having a thickness of approximately 2000 Å is evaporated (or sputtered) over the entire lower surface of the silicon nitride layer 202. This gold layer 215 is then patterned and etched in accordance with conventional processing techniques to form traces 211–214 as illustrated in FIG. 5E. A layer of strain gage material 216 (e.g., nickel-chrome) having a thickness of approximately 500 Angstroms is evaporated (or sputtered) over the entire lower surface of the silicon nitride layer 202. This layer of strain gage material 216 is then patterned and etched in accordance with conventional processing techniques, thereby forming strain gage resistors 221–224 and completing the fabrication of pressure sensor 200 (FIG. 5G). Etchants other than KOH can be used in other embodiments of the invention.

Although FIGS. 5A–5G illustrate the fabrication of a single pressure sensor 200, it is understood that many pressure sensors similar to pressure sensor 200 can be simultaneously (i.e., batch) fabricated on a silicon wafer. These batch-fabricated pressure sensors can be cut into individual pressure sensors in accordance with well known semiconductor processing techniques. Alternatively, these batch-fabricated pressure sensors can be used as an integrated-array of pressure sensors.

The operation of pressure sensor 200 will now be described. During stable atmospheric conditions (i.e., 1 ATM, no ambient air flow) or when there is equal pressure on both sides of the membrane, pressure sensor 200 remains in the position illustrated in FIGS. 2–4. That is, membrane 202 is substantially parallel to the X-Y plane, and there is no deflection of membrane 202 along the Z-axis. As a result, strain gage resistors 221–224 have equal resistances. A constant external voltage is applied across pads 211a and 213a (or alternatively, across pads 212a, and 214a). Because the strain gage resistors 221–224 all have the same resistance at this time, there is no voltage differential across pads 212a, and 214a.

Figure 6A:
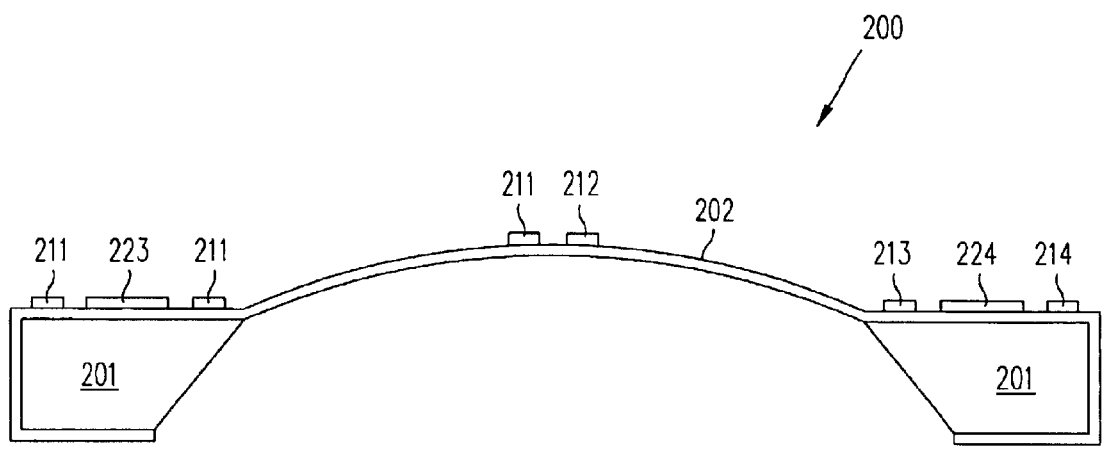
FIGS. 6A and 6B illustrate the deformation of the membrane of the pressure sensor of FIGS. 2–4.
Figure 6B:
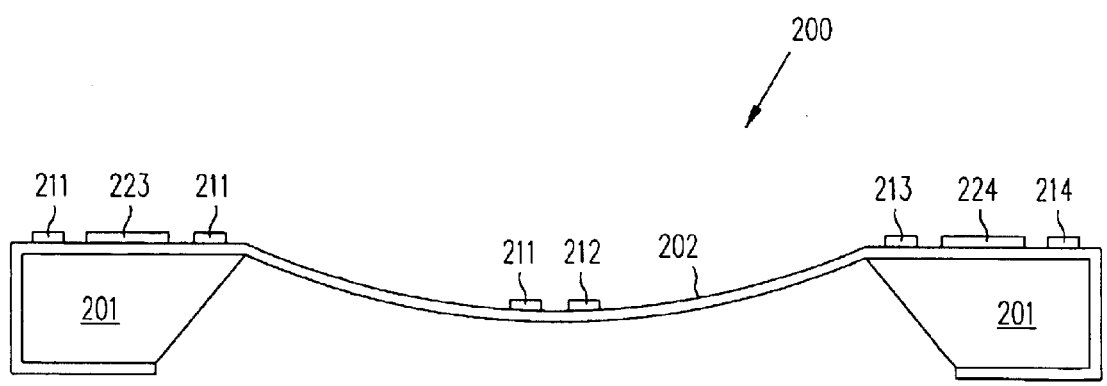

However, when the atmospheric conditions cause an external pressure to be applied to pressure sensor 200, (i.e., a pushing or pulling force in either the positive or negative Z-direction), membrane 202 deforms out of the X-Y plane, thereby causing strain gage resistors 221 and 222 to elongate. FIG. 6A illustrates deformation of membrane 202 in the positive Z direction. FIG. 6B illustrates deformation of membrane 202 in the negative Z direction. As strain gage resistors 221 and 222 elongate, the resistances of these strain gage resistors 221 and 222 increase. Because the physical layout of strain gage resistors 221 and 222 are symmetrical with respect to the deformation of membrane 202, strain gage resistors 221 and 222 deform (i.e., elongate) by approximately the same amount, the resistances of strain gage resistors 221 and 222 increase by approximately the same amount. As a result of the increased resistance of strain gage resistors 221 and 222, a voltage differential is developed across pads 212a, and 214a (if a constant input voltage is applied across pads 211a and 213a). The voltage differential across pads 212a, and 214a is proportional to the deflection of membrane 202. Because the deflection of membrane is proportional to the pressure, the voltage differential across pads 212a, and 214a is proportional to the pressure.

Pressure sensor 200 exhibits the following advantages with respect to conventional piezo-resistive pressure sensors. First, pressure sensor 200 is extremely sensitive and is capable of measuring pressures much less than 1 psi. For example, pressure sensor 200 has a sensitivity range of 5 inch water column (0.02 psi) full range to 0.005 inch water column full range. In addition, pressure sensor 200 has an improved mechanical amplification factor based on the use of a pre-stressed membrane. Moreover, because membrane 202 is pre-stressed, membrane 202 has a tremendous linear range and over-pressure protection. Because membrane 202 has a relatively low mass, the so-called G-force is almost negligible, thereby rendering pressure sensor 200 immune to static errors due to gravity (i.e., sensor position offset) or dynamic errors due to noise and vibration. These advantageous features enable pressure sensor 200 to be used in the following extremely low pressure range air-flow sensing applications: HVAC damper control, duct air flow and filter pressure drop measurement, chemical flow hoods, hospital room and clean room pressurization, medical instrumentation, industrial control/monitoring and electronics convective cooling integrity detection.

Figure 7:
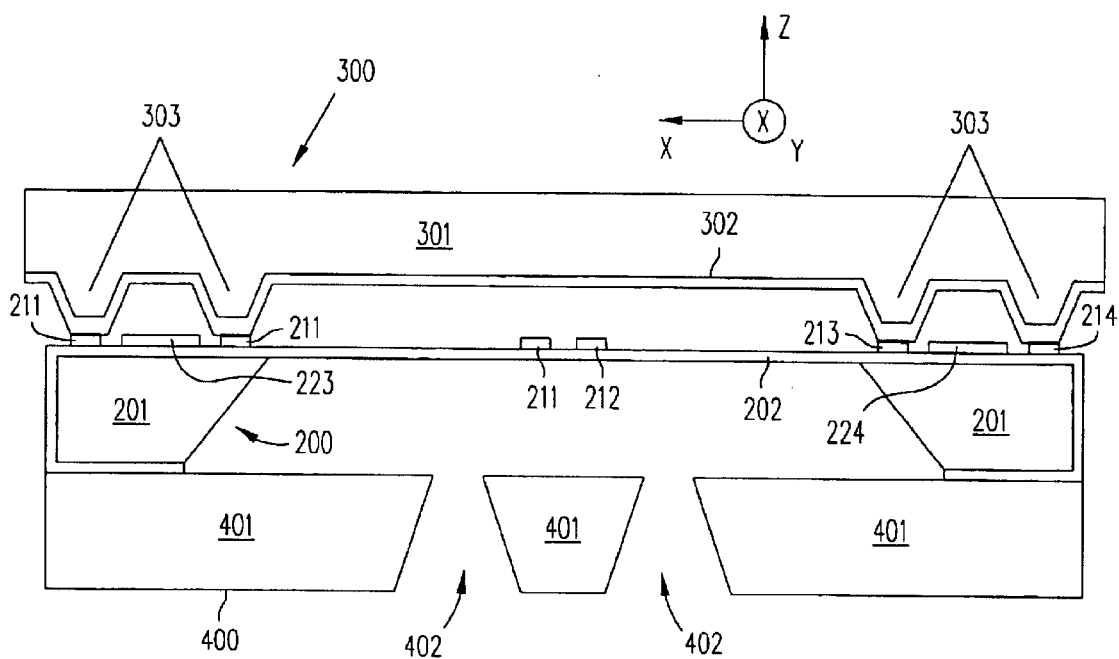
FIG. 7 is a cross sectional view illustrating the pressure sensor of FIG. 2 with upper and lower over-pressure stopper structures.

Pressure sensor 200 can be operated by itself as previously described, or connected to other structural members which act to limit the range of motion of membrane 202 in the event of exposure to an excessive pressure (i.e., an over-pressure condition). FIG. 7 is a cross sectional view of a first over-pressure stopper structure 300 and a second over-pressure stopper structure 400 connected to pressure sensor 200.

First over-pressure stopper 300 is connected to pressure sensor 200 at the surface which supports membrane 202. First over-pressure stopper 300 includes a substrate 301 having a plurality of support pads 303 formed around the perimeter of the substrate 301. In the described example, substrate 301 is monocrystalline silicon. An electrically insulating layer 302 is formed over the support pads 303 as illustrated. In the described example, insulating layer 302 is silicon oxide. Insulating layer 302 prevents the shorting of traces 211–214 and strain gage resistors 221–224 when the first over-pressure stopper 300 is coupled to pressure sensor 200. The combined height of support pads 303 and insulating layer 302 is selected to correspond with the desired maximum distance of travel of membrane 202 along the positive Z direction.

Figure 8:
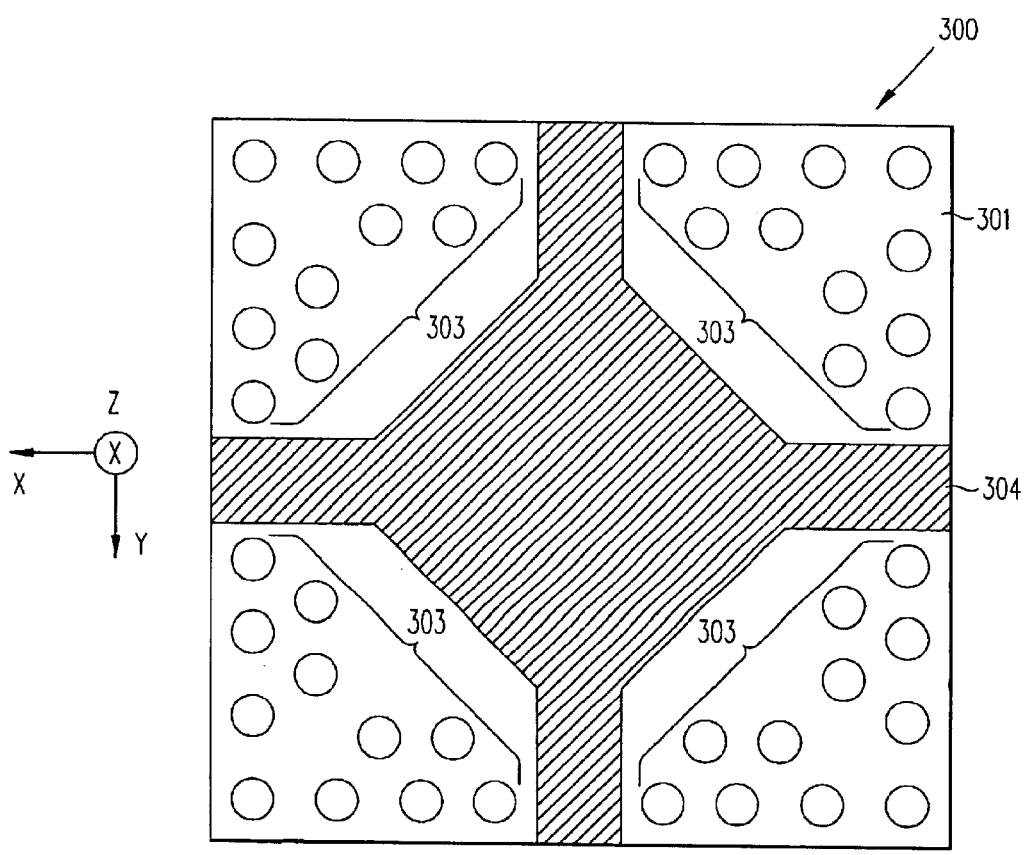
FIG. 8 is a bottom view of the upper over-pressure stopper structure of FIG. 7.

FIG. 8 is a view of the bottom of first over-pressure stopper 300. A deep channel region 304 extends from a central location to the perimeter of the stopper 300 along four channels. The deep channel region 304 vents the upper surface of membrane 202 to an external pressure. Alternatively, deep channel region 304 can be eliminated if sufficient spacing is provided between support pads 303, such that the upper surface of membrane 202 is vented to the external atmosphere by the spaces existing between the support pads 303.

Second over-pressure stopper 400 is connected to pressure sensor 200 at the surface opposite the surface which supports membrane 202. Second over-pressure stopper 400 includes a substrate 401 having a plurality of holes 402 formed therethrough. In the described example, substrate 401 is monocrystalline silicon. Holes 402 are formed in accordance with conventional semiconductor processing techniques (e.g., etching, mechanically or ultrasonically drilling). Holes 402 extend through substrate 401, thereby venting the lower surface of membrane 202 to the atmospheric pressure or another air chamber through substrate 401. In this embodiment, the height of substrate 201 is selected to correspond with the desired maximum distance of travel of membrane 202 along the negative Z direction. If a greater distance of travel is desired, support pads (similar to support pads 303) can be etched at the perimeter of the upper surface of substrate 401.

The first and second over-pressure stoppers 300 and 400 are joined to pressure sensor 200 by a bonding material or an adhesive. The patterned surface provided by support pads 303 is a somewhat irregular (i.e., non-continuous) surface which advantageously provides for improved bonding. In a variation of the above described example, the first over-pressure stopper 300 can include holes (similar to through holes 402) through substrate 301 to vent the upper surface of membrane 202. Similarly, the second over-pressure stopper 400 can include a channel (similar to channel 304) in substrate 401 to vent the lower surface of membrane 202. In yet another variation, first over-pressure stopper 300 can be used without second over-pressure stopper 400. Similarly, second over-pressure stopper 400 can be used without first over-pressure stopper 300.

Figure 9:
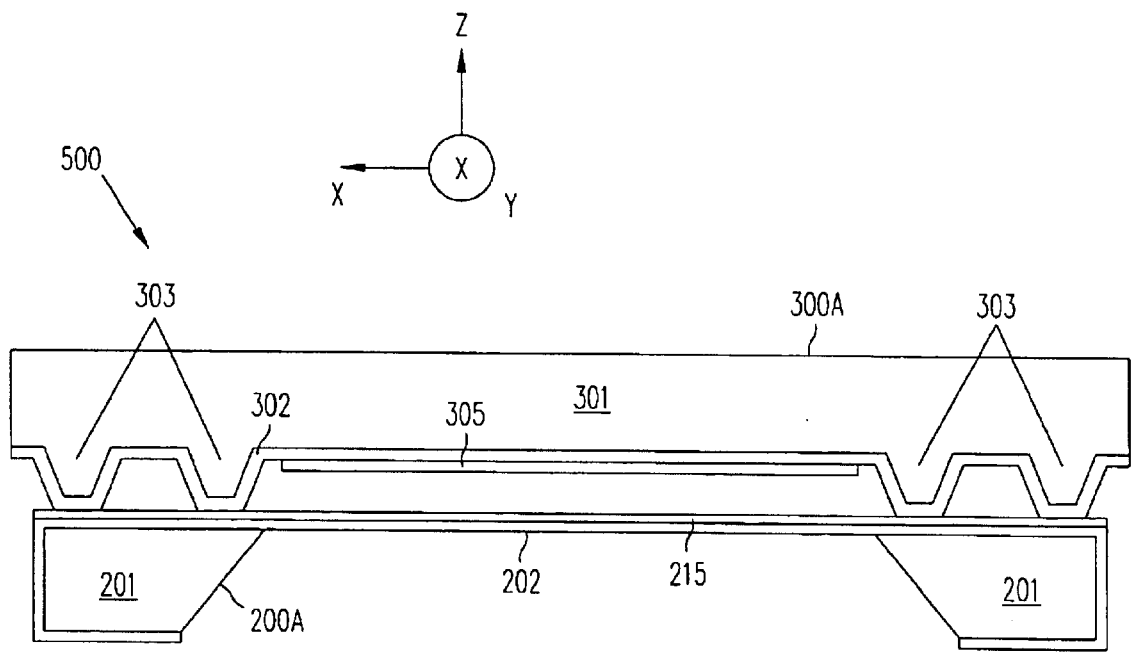
FIG. 9 is a cross sectional view illustrating a capacitive pressure sensor in accordance with an alternate embodiment of the present invention.

In an alternate embodiment of the present invention, pressure sensor 200 and first over-pressure stopper 300 are modified to create a capacitive pressure sensor. FIG. 9 is a cross sectional view of a capacitive pressure sensor 500 in accordance with such an alternate embodiment of the present invention. Capacitive pressure sensor 500 includes pressure sensor 200A and first over-pressure stopper 300A. Pressure sensor 200A and first over-pressure stopper 300A are similar to previously described pressure sensor 200 and first over-pressure stopper 300. Thus, similar elements in FIGS. 7 and 9 are labeled with similar reference numbers.

Pressure sensor 200A is formed by completing the process steps previously described in connection with FIGS. 5A–5D. Thus, pressure sensor 200A includes frame 201, membrane 202 and gold layer 215. Note that gold layer 25 is not patterned, and strain gage layer 216 is not formed in this embodiment. Over-pressure stopper 300A is formed by depositing a conductive layer 305 (e.g., gold in the channel region 304 of over-pressure stopper 300 (FIG. 8). Electrical connections are made to conductive layers 215 and 305 and the capacitance between these two layers is measured by a conventional capacitance measuring circuit. As membrane 202 deflects toward over-pressure stopper 300A, the measured capacitance will increase. Conversely, as membrane 202 deflects away from over-pressure stopper 300A, the measured-capacitance will decrease. The magnitude of the applied pressure can be derived from the measured capacitance using conventional techniques.

Applications

Various applications of pressure sensor 200 will now be described. The applications described below are intended to be illustrative, but not limiting. It is understood that the pressure sensors of the present invention can be used in many other applications, which would be apparent to one of ordinary skill in the art.

Air Flow Detector

Pressure sensor 200 can be used in a variety of applications. As illustrated in FIG. 10A, the pressure sensor 200 is packaged to form a pressure sensor assembly 900. Pressure sensor assembly 900 includes an upper molding 901 and a lower molding 902, each of which can be made of plastic. The upper molding 901 is fixed on the lower molding 902 such that an air-tight seal is formed between these two moldings. Pressure sensor 200 is affixed to the lower molding 902, such that an air-tight seal is formed. Two cavities 903 and 904 extend through the lower molding 902. Pressure sensor 200 is positioned over cavity 904, such that the lower surface of membrane 202 exposed within cavity 904. Cavity 903 extends through lower molding 902 at a location outside of the perimeter of the pressure sensor 200. As a result, the upper surface of membrane 202 is exposed to cavity 903.

Air flow tubes 910 and 911 are fitted into cavities 903 and 904 respectively. Air flow tubes 910 and 911 are hollow tubes which are open at their uppermost ends, and closed at their lowermost ends. Openings 930 and 931 are located on the face surfaces of tubes 910 and 911, respectively. Filters 920 and 921 are located over the uppermost ends of air flow tubes 910 and 911, respectively. Filters 920 and 921 prevent particles from entering housing 900 and changing the operating characteristics of membrane 202. The various bond pads 211A–214A of pressure sensor 200 can be connected to connector pins (such as connector pin 905) by bonding wires (such as bonding wire 950).

The resulting structure operates as follows. The pressure sensor assembly 900 is mounted in a location where there is an expected air flow. The pressure sensor assembly 900 is aligned such that opening 930 is facing into the direction of expected air flow, and opening 931 is facing away from the direction of the expected air flow. FIG. 10B is a top view of air flow tubes 910 and 911. Arrows 1010 indicate the direction of expected air flow. When such an air flow exists, a positive pressure P1 results through opening 930, and a negative pressure P2 results through opening 931. Opening 931 must be located at least 90 degrees out of phase with the expected direction of the air flow in order for a negative pressure (vacuum) P2 to be developed. When the expected air flow exists, the pressure difference between P1 and P2 tend to force membrane 202 out of the X-Y plane. Conversely, when the expected air flow is not present, the pressures P1 and P2 (which are approximately equal) will leave membrane 202 in a non-deflected state. By providing a positive pressure P1 on one side of the membrane 202, and a negative pressure P2 on the other side of the membrane 202, a relatively large force is applied to actuate pressure sensor 200. In an alternate embodiment, air flow tubes 910 and 911 can be replaced with a single air flow tube having two inner channels, with one hole connecting to each of the inner channels.

In addition, instead of a single hole in each of air flow tubes 910 and 911, each of air flow tubes 910 and 911 can include two or more holes, with each hole-being located at a slightly different angle relative to the air flow, but all joining to the same cavity (e.g., 903 or 904). In one example, two holes are provided with an angle of approximately five degrees between the two holes. Providing two holes enables air flow tubes 910 and 911 to be positioned with a lower degree of accuracy relative to the direction of air flow. However, with each additional hole added per air flow tube, the detected pressure decreases, giving a slight reduction in sensitivity. In yet another embodiment, holes 930 and 931 can be replaced with horizontal slit openings. Such slit openings relax the required orientation requirements of the air flow tubes with respect to the direction of air flow.

The pressure sensor assembly 900 can be mounted near a fan in a computer system, or near an electronic component to be protected. Pressure sensor 200 thereby receives the air flow created by the fan. When the air flow is greater than a predetermined threshold, membrane 202 will deform, thereby causing a differential voltage to be developed across pads 212a, and 214a. The presence of this differential voltage is then interpreted to indicate the presence of an adequate air flow in the system. The threshold of the pressure sensor 200 can be determined by adjusting the location of pressure sensor 200 both radially or axially with respect to the fan, or by changing the sensitivity of membrane 202. Because pressure sensor 200 immediately detects failure or the sub-optimal operation of the fan, overheating of the electronic components in the system can be prevented at an earlier stage than when using conventional temperature sensing devices.

In accordance with the present invention, a plurality of pressure sensor assemblies, identical to pressure sensor assembly 900, can be located throughout the system to be protected. Such an arrangement can detect localized areas of sub-optimal fan performance.

In addition to being a warning sensor, such a device can be used as a feedback sensor to control the rotational speed of a fan such that for a given system or ambient temperature, the fan can be controlled to rotate at whatever speed necessary to achieve the desired air flow. Alternatively, the number of operational fans can be controlled to achieve the desired air flow. Such an adaptive (or 'smart') fan can be used in applications where fan noise is a problem or where system reliability is a major concern.

Temperature Sensor

Figure 11:
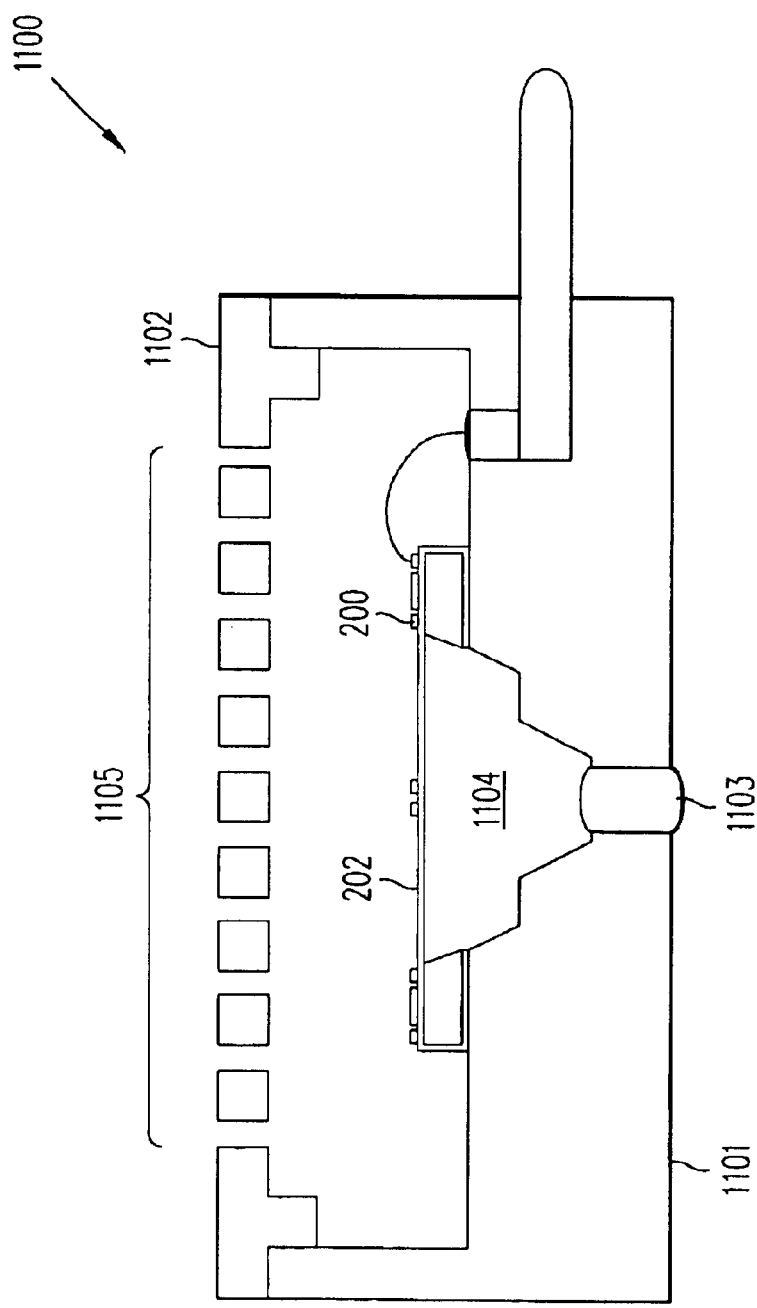
FIG. 11 is a cross sectional view of a pressure sensor which is adapted for use as temperature sensor in accordance with one embodiment of the invention.

As illustrated in FIG. 11, in accordance with an alternative embodiment of the present invention, pressure sensor 200 can be used to form a temperature sensor 1100. Temperature sensor 1100 includes pressure sensor 200, lower housing member 1101, upper housing member 1102 and plug 1103. A cavity 1104 extends through lower housing member 1101. Pressure sensor 200 is affixed to housing member 1101 with an air-tight seal, such that the lower surface (or upper surface) of membrane 202 is exposed by cavity 1104. Upper housing member 1102 is affixed to lower housing member 1101 as illustrated. Upper housing member 1102 includes a filter 1105 which vents the upper surface (or lower surface) of membrane 202. While controlling the ambient temperature, the cavity 1104 is go sealed (air tight) with plug 1103. As a result, cavity 1104 becomes a closed cavity which contains a fixed amount of air. When this air is heated (or cooled), it expands (or contracts), thereby causing the conductive membrane to deform. By controlling the temperature at which temperature sensor 1100 is sealed and the sensitivity of pressure sensor 200, the operating characteristics of temperature sensor 1100 can be controlled.

Vacuum Detector

Figure 12:
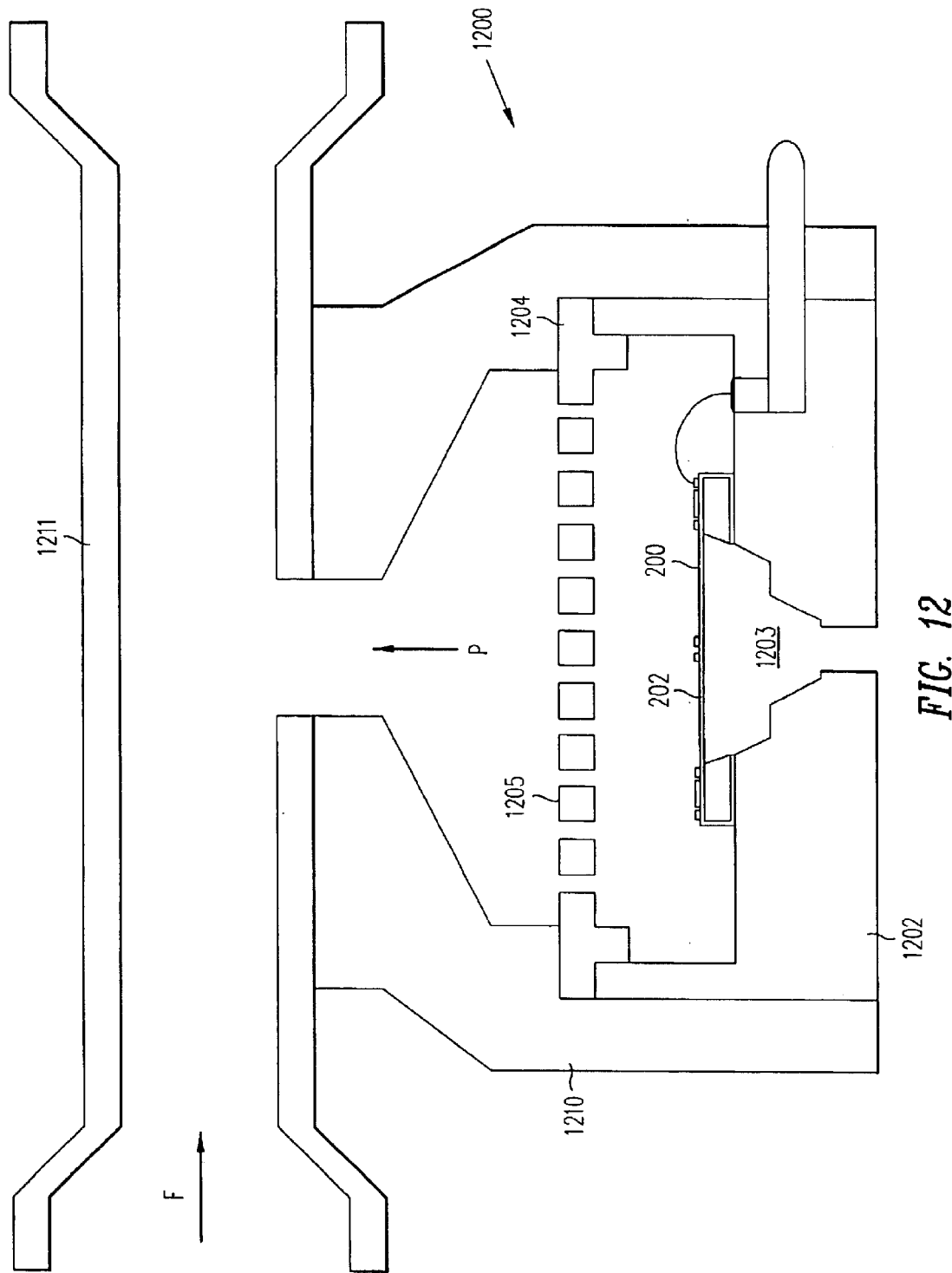
FIG. 12 is schematic diagram of a pressure sensor which is adapted for use as vacuum sensor in accordance with another embodiment of the invention.

In another application, the pressure sensor 200 can be used to detect vacuum (or pressure) in a chamber or air flow by detecting a vacuum in a channel, such as in an air conditioning system, a furnace or in semiconductor processing equipment. FIG. 12 is a schematic diagram of a vacuum pressure sensor 1200 in accordance with another embodiment of the invention. The vacuum pressure sensor 1200 includes pressure sensor 200, which is affixed to a lower housing element 1202. An opening 1203 extends through housing element 1202, thereby exposing the lower surface (or upper surface) of membrane 202. An upper housing element 1204 having a filter 1205 is attached to the lower housing element 1202. The lower housing element 1202 and upper housing 1204 are fitted into a larger housing 1210 which is tapped off of an air flow tube 1211 (e.g., a venturi). In the absence of air flow through tube 1211, membrane 202 is in a non-deflected state. However, when an air flow F is introduced in tube 1211, membrane 202 is deflected by the negative pressure P induced in the housing 1210.

Pitot Tube

Figure 13:
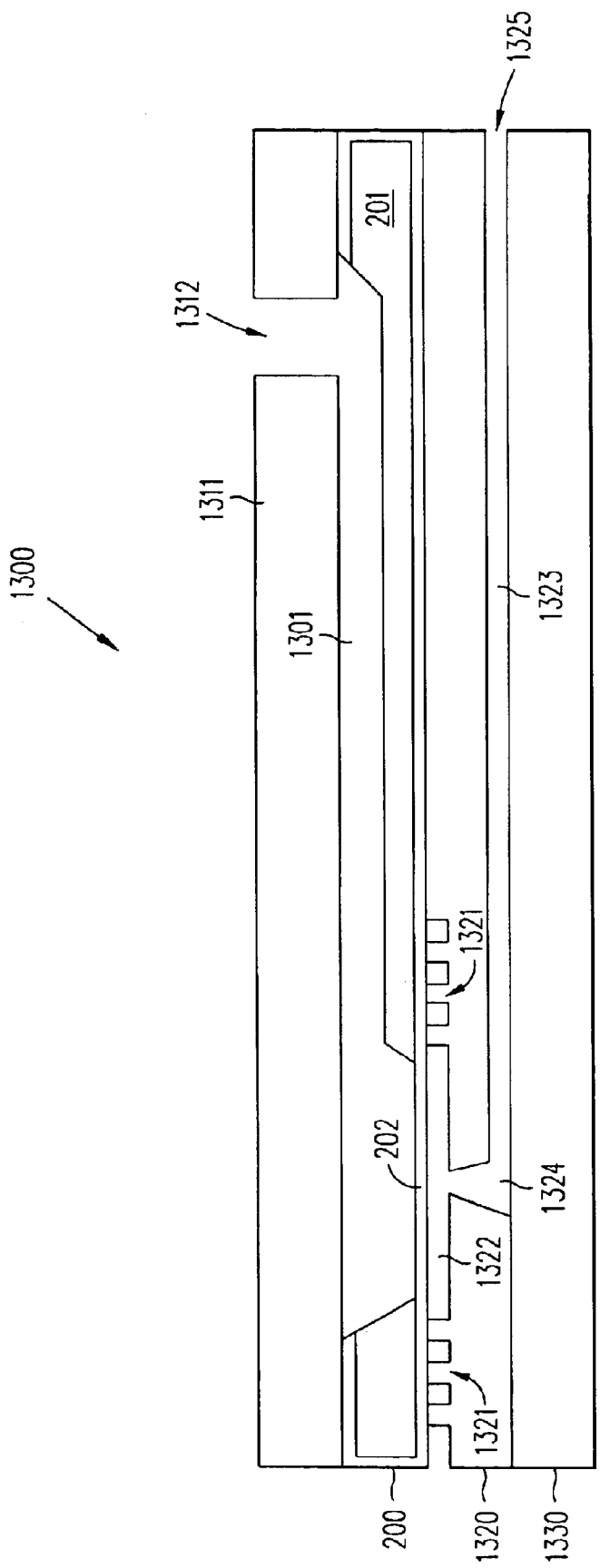
FIGS. 13, 14 and 15 are cross sectional views of pressure sensors which are adapted for uses as pitot tubes in accordance with alternative embodiments of the invention.

In yet another application, the pressure sensor 200 can be adapted for use in a silicon micro-machined pitot tube. FIG. 13 is a cross sectional diagram of a pitot tube 1300 in accordance with one embodiment of the invention. In this embodiment, substrate 201 of pressure sensor 200 is extended, and a trough 1301 is formed in the upper surface of the extended portion of the substrate 201. An upper layer 1311 of structural material, such as monocrystalline silicon, is affixed over the upper surface of substrate 201. An opening 1312 extends through upper layer 1311. The opening 1312 and trough 1301 vent the upper surface of membrane 202 to the outer atmosphere.

A lower structural layer 1320 is attached to the lower surface of pressure sensor 200 as illustrated. Lower structural layer 1320 includes support pads 1321, which result in a cavity 1322, a trough 1323 at the lower surface of layer 1320, and an opening 1324 which extends between cavity 1322 and trough 1323. Trough 1323 extends to the outer perimeter of the lower structural layer 1320 at point 1325. A lower cover layer 1330 is affixed to the lower surface of lower structural layer 1320. As a result, the lower surface of membrane 202 is vented to the outer atmosphere through cavity 1321, trough 1323 and opening 1324.

The resulting structure can be used to measure air velocity as in a conventional pitot tube. Assuming that the incoming air flow, F, has a velocity $V_1$ and a pressure $P_1$, then at any other point in the flow we have $$P_2 + \tfrac{1}{2}\rho V_2^2 = P_1 + \tfrac{1}{2}\rho V_1^2$$

where $\rho$ is the mass density of air. Since opening 1325 is pointing towards the flow, and the corresponding trough 1323 extends all the way to the cavity 1322 where the flow velocity $V_2$ is zero, the pressure at the bottom surface of membrane 202 must be $$P_2 = P_1 + \tfrac{1}{2}\rho V_1^2$$

On the other hand, the opening 1312 is pointing a direction perpendicular to the flow, so through the trough 1301, the pressure at the top surface of the membrane 202 is simply $P_1$, then the differential pressure on membrane 202 is $$\Delta P = P_2 - P_1 = \tfrac{1}{2}\rho V_1^2$$

The differential pressure results in deformation of membrane 202. This deformation, in turn, results in a differential voltage, which can be used to determine the air flow F.

Figure 14:
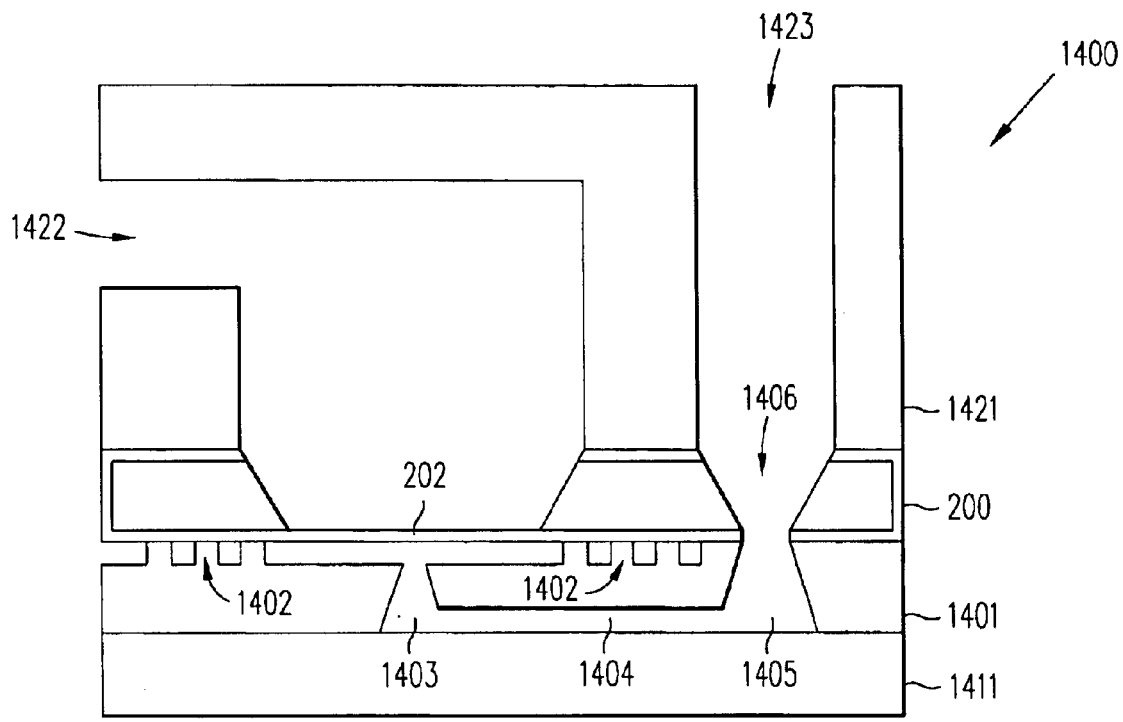

Other pitot tube structures can also be implemented using the structure of pressure sensor 200. For example, FIG. 14 illustrates a three layer pitot tube structure 1400 which includes three structural members 1401, 1411 and 1421 coupled to pressure sensor 200. Structural member 1401 includes support pads 1402, opening 1403, channel 1404 and opening 1405. The upper surface of structural member 1401 (i.e., the surface which includes support pads 1402) is attached to pressure sensor 200 as illustrated. Structural member 1411 is affixed to the lower surface of structural member 1401.

Structural member 1421, which is affixed to pressure sensor 200 as illustrated, includes two openings 1422 and 1423. Opening 1422, which has a 90 degree bend, vents the upper surface of membrane 202. Opening 1422, which is a straight opening, is continuous with an opening 1406 formed in pressure sensor 200. Opening 1406 extends between openings 1423 and 1405, thereby venting the lower surface of membrane 202. Pitot tube structure 1400 operates in the same manner previously described for pitot tube structure 1400.

Figure 15:
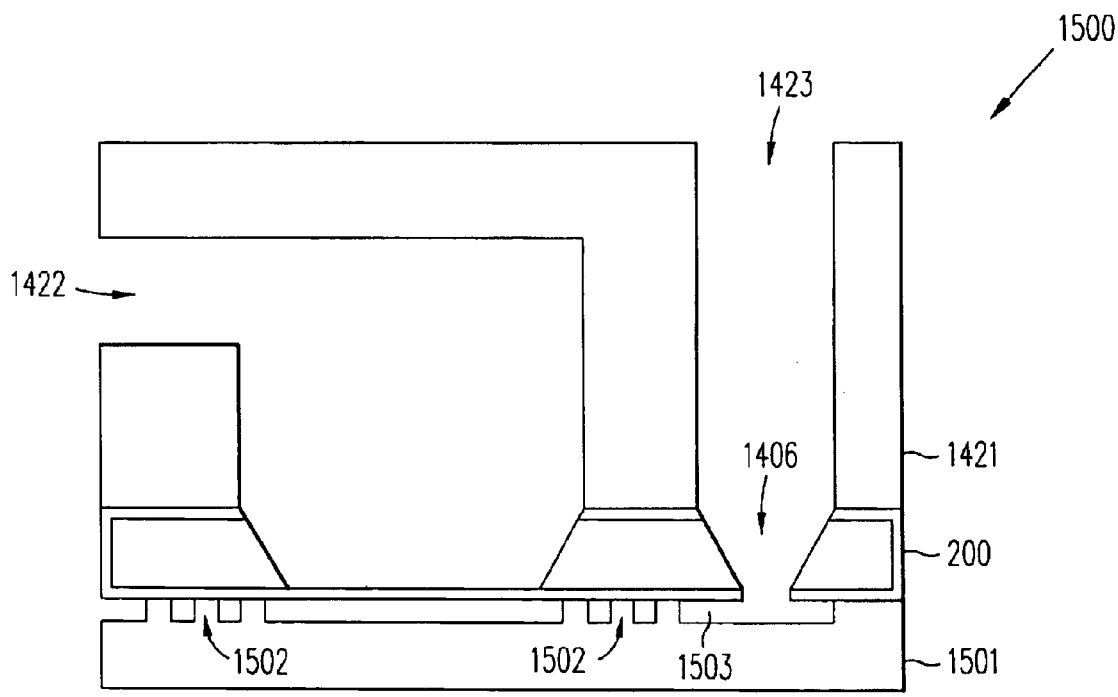

Similarly, FIG. 15 illustrates a two layer pitot tube structure 1500. Similar elements in pitot tube structures 1400 and 1500 are labeled with similar reference numbers. Pitot tube structure 1500 replaces structural members 1401 and 1411 of pitot tube structure 1400 with a single structural member 1501. Structural member 1501 includes support pads 1502, as well as a channel 1503 which vents the underside of membrane 202 to openings 1423 and 1406. Channel 1503 is formed in the same manner previously described for channel 304 (FIG. 8). Pitot tube structure 1500 operates in the same manner as pitot tube structures 1300 and 1400. In another embodiment, a pitot tube structure can be made of another material (such as plastic) and bonded to the switch (which is made from silicon).

Chemical Detector

Figure 16:
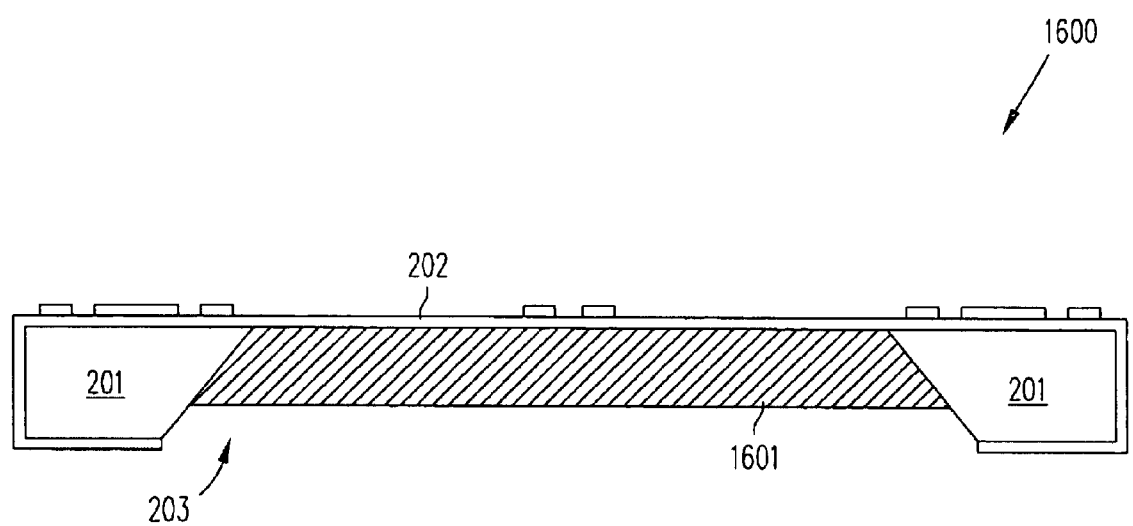
FIG. 16 is a cross sectional view of a pressure sensor which is modified to operate as a chemical detector in accordance with another embodiment of the invention.

FIG. 16 illustrates a pressure sensor which is adapted for use as a gas or chemical detector 1600 (for example, carbon monoxide). In this embodiment of the invention, a chemical absorbent material 1601, is deposited over the membrane 202 within opening 203. Material 1601 absorbs chemical present in the ambient atmosphere. Upon absorption, the material 1601 expands, thereby forcing membrane 202 to deform. The resulting voltage differential can be used to identify the presence of an excessive amount of a toxic chemical in the ambient atmosphere.

Although the invention has been described in connection with several embodiments, it is understood that this invention is not limited to the embodiments disclosed, but is capable of various modifications which would be apparent to a person skilled in the art. For example, although the present invention has been described in connection with strain gage resistors which are connected to form a Wheatstone bridge circuit, it is understood that one of ordinary skill in the art could implement other type of sensing circuits by forming one or more strain gage resistors over the membrane of the pressure sensor. In addition, although pressure sensor 200 was described as having particular dimensions, these dimensions are illustrative and not limiting. Other dimensions are possible and considered to be within the scope of the present invention. Thus, the invention is limited only by the following claims.

What is claimed is:

1. A pressure sensor comprising:
    a semiconductor frame having an opening;
    a flexible membrane which extends over the semiconductor frame and over the opening of the semiconductor frame; and
    a first strain gage resistor formed over a portion of the membrane which extends over the opening of the semiconductor frame.

2. The pressure sensor of claim 1, wherein the semiconductor frame comprises monocrystalline silicon.

3. The pressure sensor of claim 1, wherein the membrane comprises silicon nitride.

4. The pressure sensor of claim 1, wherein the first strain gage resistor comprises nickel-chrome.

5. The pressure sensor of claim 1, further comprising a second strain gage resistor formed over a portion of the membrane which extends over the opening of the semiconductor frame.

6. The pressure sensor of claim 5, wherein the first strain gage resistor and the second strain gage resistor are symmetrical.

7. The pressure sensor of claim 5, wherein the first strain gage resistor and the second strain gage resistor each have a serpentine shape.

8. The pressure sensor of claim 5, wherein the first strain gage resistor and the second strain gage resistor have the same resistance values.

9. The pressure sensor of claim 5, further comprising:
    a third resistor formed over a portion of the membrane which extends over the semiconductor frame;
    a fourth resistor formed over a portion of the membrane which extends over the semiconductor frame; and
    a plurality of electrically conductive traces formed over the membrane, wherein the traces connect the first strain gage resistor, the second strain gage resistor, the third resistor and the fourth resistor in a Wheatstone bridge circuit.

10. The pressure sensor of claim 9, wherein the third and fourth resistors are strain gage resistors.

11. The pressure sensor of claim 1, further comprising a first stopper coupled to the semiconductor frame, wherein the first stopper extends over the membrane and limits deflection of the membrane along a first direction.

12. The pressure sensor of claim 11, further comprising a second stopper coupled to the semiconductor frame, wherein the second stopper extends over the membrane and limits deflection of the membrane along a second direction, opposite the first direction.

* * * * *